(12) United States Patent
Yeh et al.

(10) Patent No.: US 8,518,634 B2
(45) Date of Patent: Aug. 27, 2013

(54) CLEANING PROCESS FOR SEMICONDUCTOR DEVICE FABRICATION

(75) Inventors: Ming-Hsi Yeh, Hsinchun (TW); Yu-Fu Lin, Hsinchu (TW); Shao-Yen Ku, Jhubei (TW); Chi-Ming Yang, Hsian-San District (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 185 days.

(21) Appl. No.: 13/022,931

(22) Filed: Feb. 8, 2011

(65) Prior Publication Data

US 2012/0202156 A1 Aug. 9, 2012

(51) Int. Cl.
*G03F 7/26* (2006.01)
*G03F 7/40* (2006.01)

(52) U.S. Cl.
USPC .......................................... 430/331; 430/311

(58) Field of Classification Search
USPC .................................. 430/311, 331
See application file for complete search history.

(56) References Cited

U.S. PATENT DOCUMENTS

| | | | |
|---|---|---|---|
| 5,853,961 A | 12/1998 | Sakai et al. | |
| 5,887,605 A | 3/1999 | Lee et al. | |
| 6,594,847 B1 | 7/2003 | Krusell et al. | |
| 6,824,621 B2 | 11/2004 | Shibagaki | |
| 2008/0156346 A1 | 7/2008 | Wang et al. | |
| 2008/0166872 A1* | 7/2008 | Takigawa | 438/637 |
| 2009/0205677 A1 | 8/2009 | Thakur et al. | |
| 2010/0104988 A1* | 4/2010 | Hayasaki et al. | 430/432 |
| 2010/0233449 A1* | 9/2010 | Terai et al. | 428/195.1 |

OTHER PUBLICATIONS

Dan Syverson; "Implant Stripping: Steam Injection for Uniform Wet Stripping;" 2010; Issue II; pp. 20-23; www.euroasiasemiconductor.com.

Ming-Hsi Yeh; Kuo-Sheng Chuang; Ying-Hsueh Chien; Chi-Ming Yang; Chi-Wen Liu and Chin-Hsiang Lin; "Chemical Dispersion Method and Device;" U.S. Appl. No. 13/198,420, filed Aug. 4, 2011; 25 Pages.

Ming-Hsi Yeh; Kuo-Sheng Chuang; Ying-Hsueh Chang Chien; Chi-Ming Yang and Chin-Hsiang Lin; "Semiconductor Device Cleaning Method and Apparatus;" U.S. Appl. No. 13/210,998, filed Aug. 16, 2011; 23 Pages.

Manish Chandhok; Kent Frasure; E. Steve Putna; Todd R. Younkin; Willy Rachmady; Uday Shah and Wang Yueh; "Improvement in Linewidth Roughness by Postprocessing;" Nov./Dec. 2008; pp. 2265-2270; J. Vac. Sci. Technol. B 26(6); American Vacuum Society.

\* cited by examiner

*Primary Examiner* — Kathleen Duda
(74) *Attorney, Agent, or Firm* — Haynes and Boone, LLP

(57) ABSTRACT

A method of making an integrated circuit is provided. The method includes providing a substrate having a photosensitive layer. The photosensitive layer is exposed to a radiation beam. The exposed photosensitive layer is developed in a first chamber. In the first chamber, a cleaning process is performed on the developed photosensitive layer. The cleaning process includes using a rinse solution including at least one of ozone, hydrogen peroxide, and oxalic acid.

18 Claims, 5 Drawing Sheets

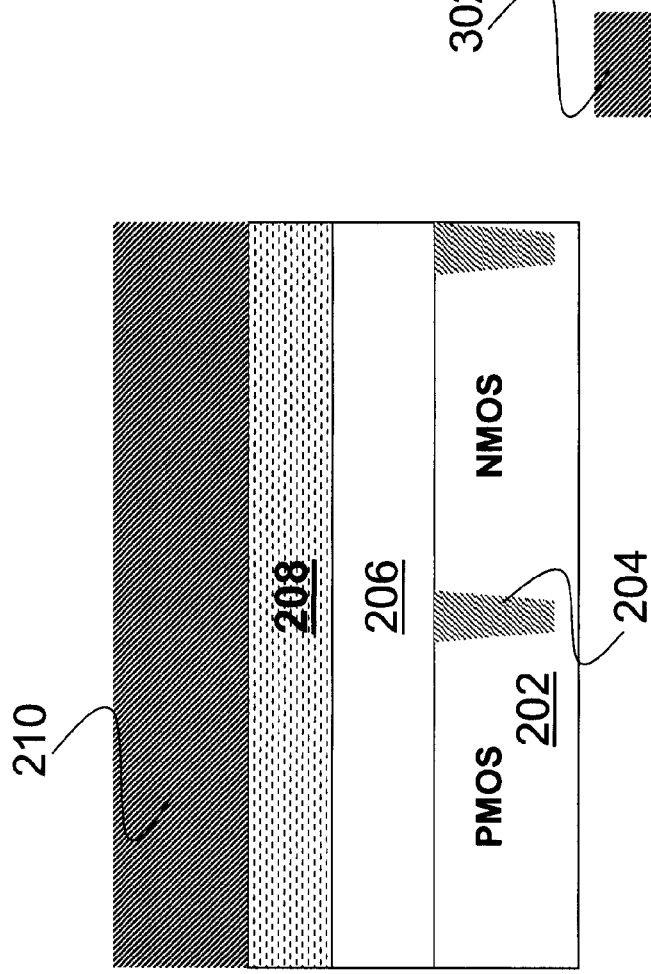
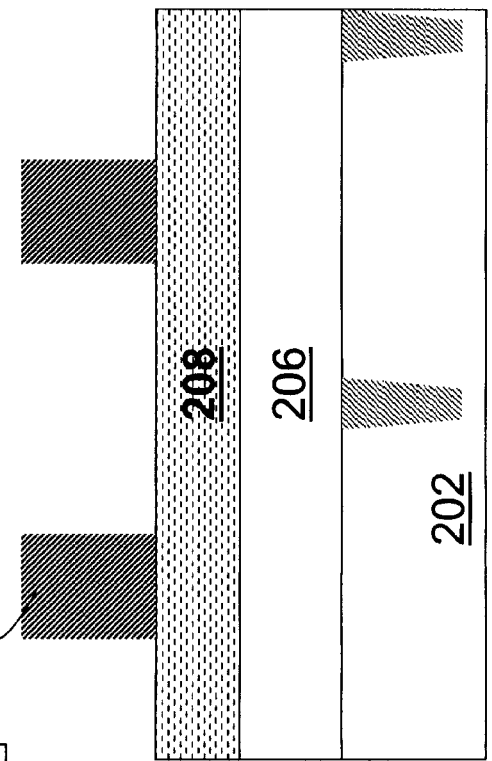
FIG. 2
FIG. 3

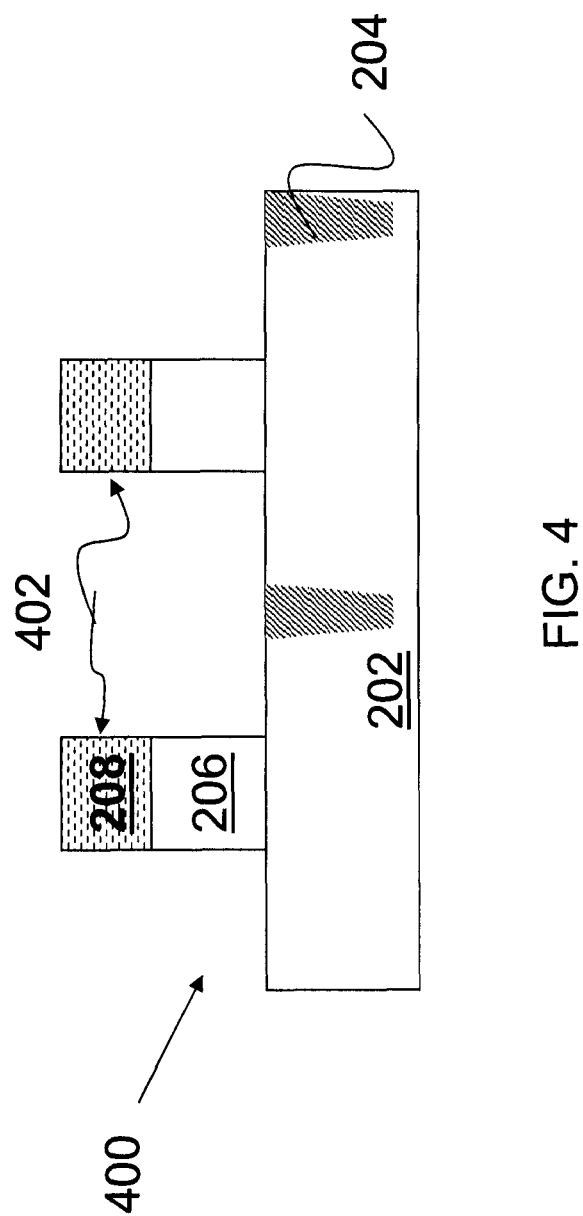

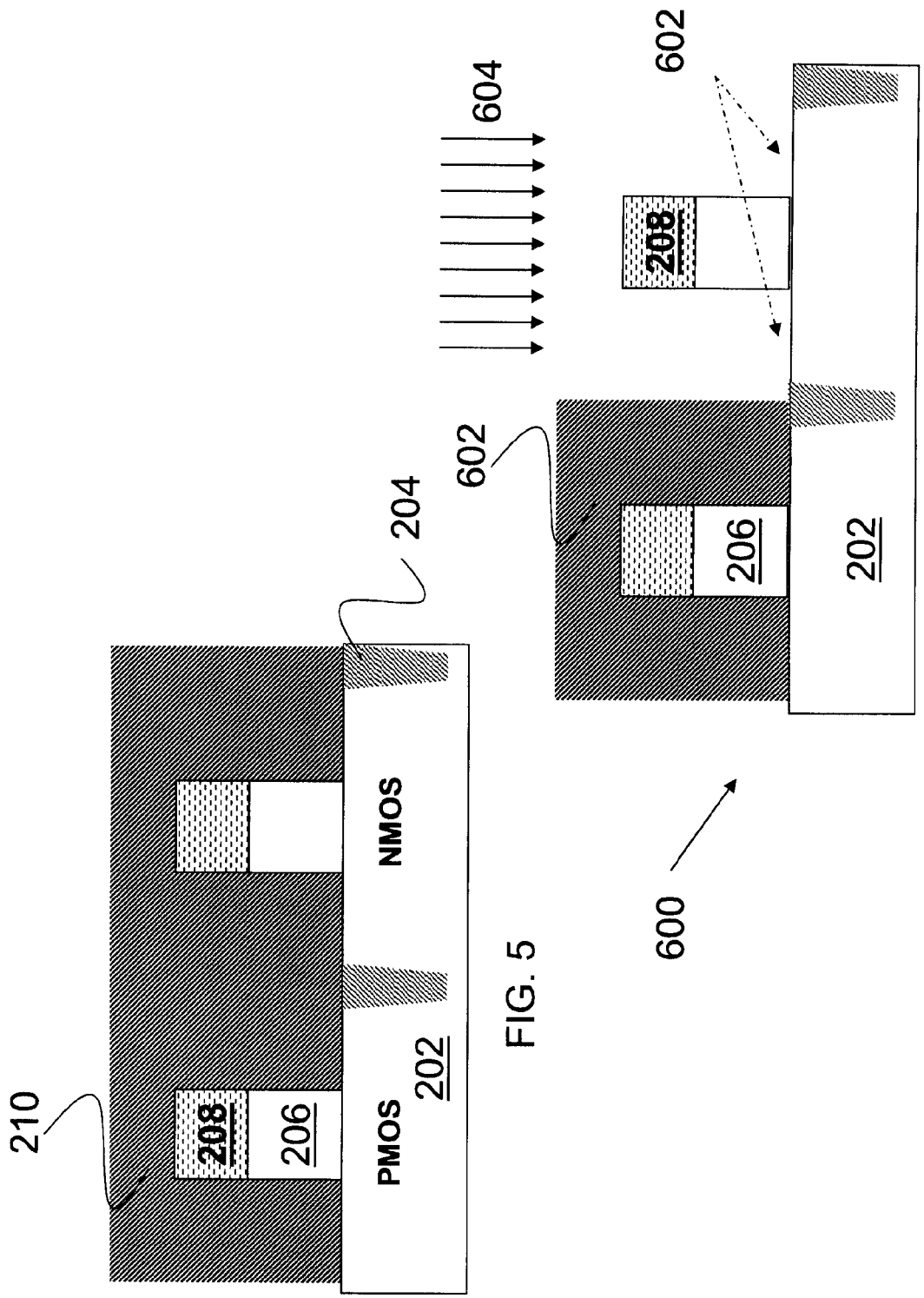

CLEANING PROCESS FOR SEMICONDUCTOR DEVICE FABRICATION

BACKGROUND

As the technology of semiconductor fabrication processes, the critical dimension (CD) has been reduced making lithography processes more and more challenging. Of particular importance is the control of line width roughness (LWR) or line edge roughness (LER). Line edge or width roughness generally refers to the roughness of a width or edge of a line of material in a semiconductor device (e.g., during fabrication). Uncontrolled LWR and LER can have a significant impact on the resulting semiconductor device (e.g., transistor). These impacts include parametric device performance and yield, for example, variations in critical dimension (CD) can cause variations is current (Ioff, Idsat). Other key concerns of the photolithography process include defects such as particles and water-marks. The conventional photolithography processes are typically insufficient to address these concerns. Therefore, a photolithography process and/or clean addressing the above issues is needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-4 are sectional views of one embodiment of a semiconductor structure at various fabrication stages processed according to various aspects of the present disclosure.

FIGS. 5-6 are sectional views of one embodiment of a semiconductor structure at various other fabrication stages processed according to various aspects of the present disclosure.

DETAILED DESCRIPTION

Figure 1:
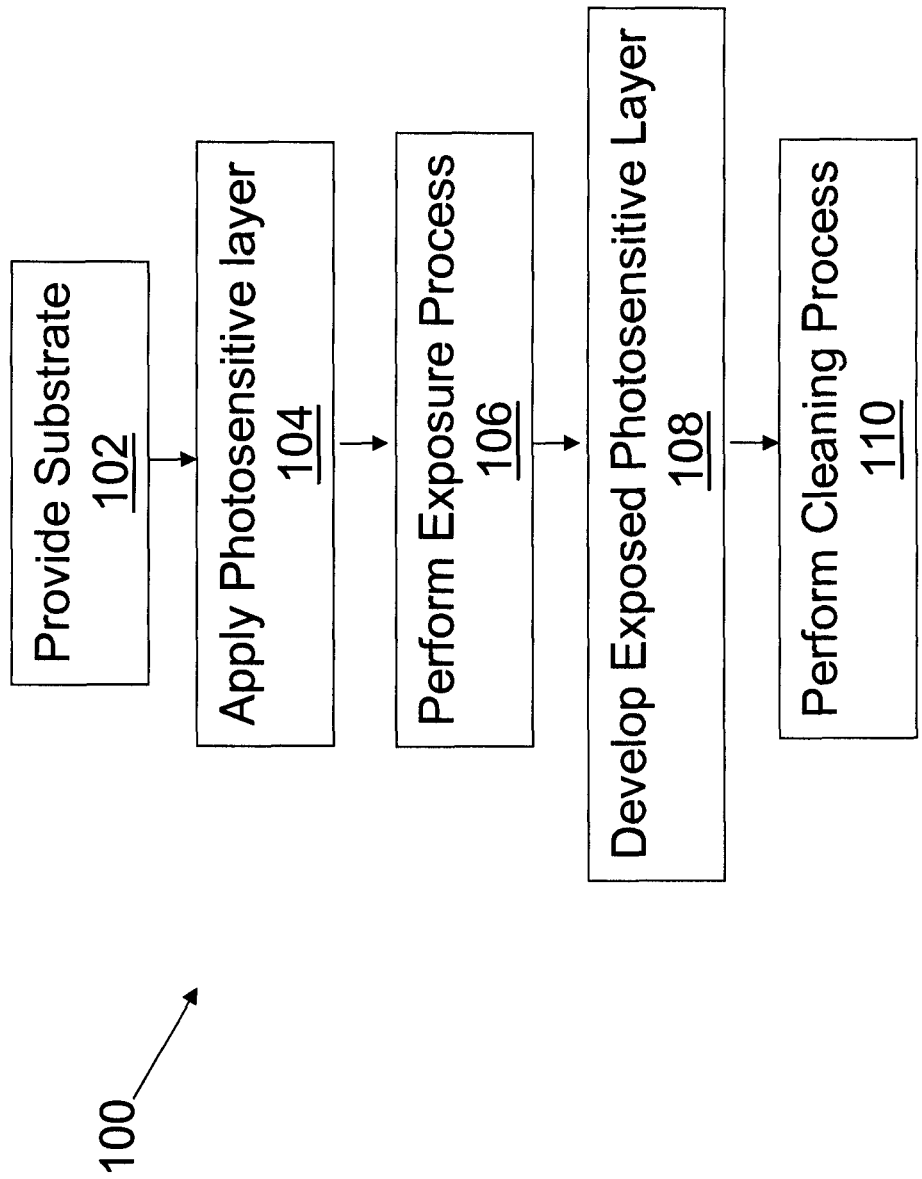
FIG. 1 is a flowchart of an embodiment of a method making a semiconductor device according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure is directed, at times, to integrated circuit device manufacturing. However, one would recognize the benefits of the present disclosure can be applied in other device technologies, such as liquid crystal display (LCD) and/or any other technology which uses a photolithography process.

FIG. 1 is a flowchart of a method 100 for making a semiconductor device according to one embodiment. The method of fabrication includes a post-photolithography rinse according to one or more aspects of the present disclosure. FIGS. 2, 3, and 4 are sectional views of a semiconductor structure 200 at various fabrication stages and constructed according to one or more embodiments of the method 100. Similarly, FIGS. 5 and 6 are sectional views of a semiconductor structure 500 at various fabrication stages and constructed according to one or more embodiments of the method 100. The fabrication stages of FIGS. 5 and 6 may be subsequent to those depicted in FIGS. 2, 3, and 4.

Referring to FIG. 1, the method 100 begins at block 102 by providing a semiconductor substrate. The semiconductor substrate may have one or more layers (e.g., insulating layers, conductive layers, etc) formed thereon. The semiconductor substrate may include silicon. Alternatively, the substrate includes germanium, silicon germanium or other proper semiconductor materials. In one embodiment, the semiconductor substrate includes a first region (resistor region) for one or more semiconductor devices (e.g., FET) and a second region (device region) for one or more semiconductor devices (e.g., FET). Various STI features may be formed in the substrate. The formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate also includes various doped regions (e.g., n-wells and p-wells) formed in various active regions.

Referring to the example of FIGS. 2 and 5, respectively. A semiconductor substrate 202 is illustrated. The semiconductor substrate 202 includes shallow trench isolation (STI) features 204 formed therein. The STI features 204 may serve to isolate regions of the semiconductor substrate, as described above. In the illustrated embodiments, STI feature 204 isolates a PMOS and NMOS region, however, any configuration is possible and within the scope of the present disclosure. A first layer 206 and a second layer 208 are formed on the substrate 202. In an embodiment, the first layer 206 is polysilicon. In an embodiment, the second layer 208 is a hard mask. Example hard mask compositions include as silicon nitride (SiN) or silicon oxide ($SiO_2$). In the exemplary embodiment of FIG. 2, the first and second layers 206, 208 are target layers to be patterned (e.g., to form a gate structure). In the exemplary embodiment of FIG. 5, the first and second layers 206, 208 have been patterned to form a gate structure 502. In an embodiment, the gate structure 502 is a dummy (e.g., sacrificial) gate used in a gate-replacement process (e.g., to form a metal gate of a transistor device).

Referring again to FIG. 1, the method 100 then proceeds to block 104 where a photosensitive layer (e.g., photoresist) is formed on the substrate. The photoresist layer may be formed using a spin-on coating process. The photoresist may be a negative or positive type photoresist of any suitable composition. The photoresist layer may be soft baked after its deposition. Referring to the example of FIGS. 2 and 5 respectively, a photoresist layer 210 layer is formed on the substrate 202.

The method 100 then proceeds to block 106 where an exposure process is performed on the photosensitive layer. The exposure process patterns the photosensitive layer. The exposure process may include introducing a radiation beam to the substrate. The radiation beam may be ultraviolet and/or can be extended to include other radiation beams such as ion beam, x-ray, extreme ultraviolet, deep ultraviolet, and other proper radiation energy. The exposure process may be part of an immersion lithography process, electron-bam writing, ion-beam writing, maskless photolithography, molecular imprint, and/or other suitable patterning processes. A post-exposure bake (PEB) may be performed to allow the exposed photoresist polymers to cleave.

The method then proceeds to block 108 where the exposed photosensitive layer is developed (e.g., a developer is applied to the patterned resist to remove the soluble portions of the layer). The substrate including the cleaved polymer photoresist is transferred to a developing chamber to remove portions of the photoresist (e.g., the exposed resist) that is soluble to an aqueous developer. In an embodiment, the developer is tetramethyl ammonium hydroxide (TMAH). However, other compositions suitable compositions now known or later developed are also within the scope of the disclosure. A surfactant may also be included. The surfactant may selected from surfactants such as, 3M Novec fluid HFE-7000, HFE-7100, HFE-7200, HFE-7500, HFE-71IPA. 3M Fluorinert FC-72, FC-84, FC-77, FC-3255, FC-3283, FC-40, FC-43, FC-70. 3M Novec 4200, 3M Novec 4300, 3M FC-4432. 3M FC-4430, 3M FC-4434 and/or other surfactants known in the art. The developer may be applied by a puddling process, immersion, spray, and/or other suitable methods.

Referring to the example of FIG. 3, the photosensitive layer has been patterned (e.g., exposed and developed) to form features 302. The features 302 may be used as masking elements in the formation of a gate structure (e.g., a dummy gate structure). Referring to the example of FIG. 6, the photosensitive layer has been patterned to expose a portion of the substrate 202 (e.g., NMOS region), while a feature 602 of photoresist masks (protects) a second region (e.g., PMOS) of the substrate 202. Alternatively, if a hard mask layer (e.g., second layer 208) is not present, then the patterned photoresist layer may be directly used as an etch mask to etch the gate material layers.

Referring again to FIG. 1, the method 100 then proceeds to block 110 where a cleaning process is performed on the substrate, including the developed photosensitive layer. In an embodiment, the cleaning process is performed in-situ with the development process, described above with reference to block 108. In other words, the substrate is loaded in a chamber where it is exposed to a developer and subsequently to a rinse solution in a cleaning process before being removed from the chamber. The development and cleaning process may be performed in a development tool. The development tool may be a typical development tool that has been modified and/or other configured to perform the cleaning process including introducing a rinse solution.

In an embodiment, the rinse solution is a de-ionized water (DIW) and ozone ($O_3$) solution. An exemplary concentration of the DIW/$O_3$ rinse solution is between approximately 1 ppm and 500 ppm of ozone. In an embodiment, the rinse solution is a DIW and hydrogen peroxide $H_2O_2$ solution. An exemplary concentration of DIW/$H_2O_2$ rinse solution is between approximately 0.1% and 10% by weight of $H_2O_2$. In an embodiment, the rinse solution is a DIW and oxalic acid solution. An exemplary concentration of DIW/oxalic acid rinse solution is a concentration of oxalic acid between approximately 0.05% and 10% by weight.

In further embodiments, a trace amount of acid may be included in the rinse solution. For example, the DIW/$O_3$ or DIW/$H_2O_2$ solutions described above may include a trace amount of acid. The trace acid may be HCl, acetic acid, citric acid, tartaric acid, and/or other similar acids. In an embodiment, the rinse solution includes between approximately 0.01 and approximately 10% by weight of HCl. In an embodiment, the rinse solution includes between approximately 0.01 and approximately 10% by weight of citric acid. In an embodiment, the rinse solution includes between approximately 0.01 and approximately 10% by weight of tartaric acid.

The following process parameters are exemplary only and not intended to be limiting. An exemplary process temperature for the cleaning process is between approximately 10° C. and approximately 80° C. The rotational speed of the substrate during the rinse solution application may be between approximately 10 rpm and approximately 3000 rpm. The flowrate of the rinse solution may be between approximately 100 sccm and approximately 10 slm.

In an alternative embodiment, the rinse solution such as described above, is not applied in-situ. In an embodiment, after a development process, the substrate may be rinsed with DI water, baked, and then the above described cleaning process may be performed.

Following the cleaning process, the substrate may be dried, for example, using a spin-dry process. In some embodiment, a hard bake process may be performed after the cleaning process.

The method 100 may then proceed to subsequent steps in semiconductor fabrication. For example, in the exemplary embodiment of FIG. 4, after the cleaning process, the photoresist features 302 may be used as masking elements to etch the first layer 206 and/or the second layer 208. Thus, the gate structures 402 may be formed. The patterned photoresist layer 302 may be removed thereafter using a suitable process, such as wet stripping or plasma ashing. It is noted that the device 400 may include several advantages over the prior art. For example, the cleaning process may provide an improvement of the LWR of the photoresist features 302 and thus, the LWR of the gate features 402 including the polysilicon layer 206.

As a further example, the method 100 may proceed to include steps such as illustrated in FIG. 6. After the cleaning process, an implantation process 604 may be performed on the device 600. The implantation process may provide a portion (e.g., lightly doped source and drain (LDD)) of the source/drain of a device formed on the substrate 202. The patterned photoresist layer 602 may be removed thereafter using a suitable process, such as wet stripping or plasma ashing. The device 600 may experience improvements over the conventional devices as the cleaning process may reduce and/or eliminate a residue of photosensitive material from the substrate 202 in regions denoted as 602.

The embodiments of FIGS. 2,3, 4, 5, and 6 are exemplary only and not intended to be limiting. The method 100 including the cleaning process described above with reference to block 110 may performed during any stage of fabrication and in conjunction with any lithography process.

Figure 7:
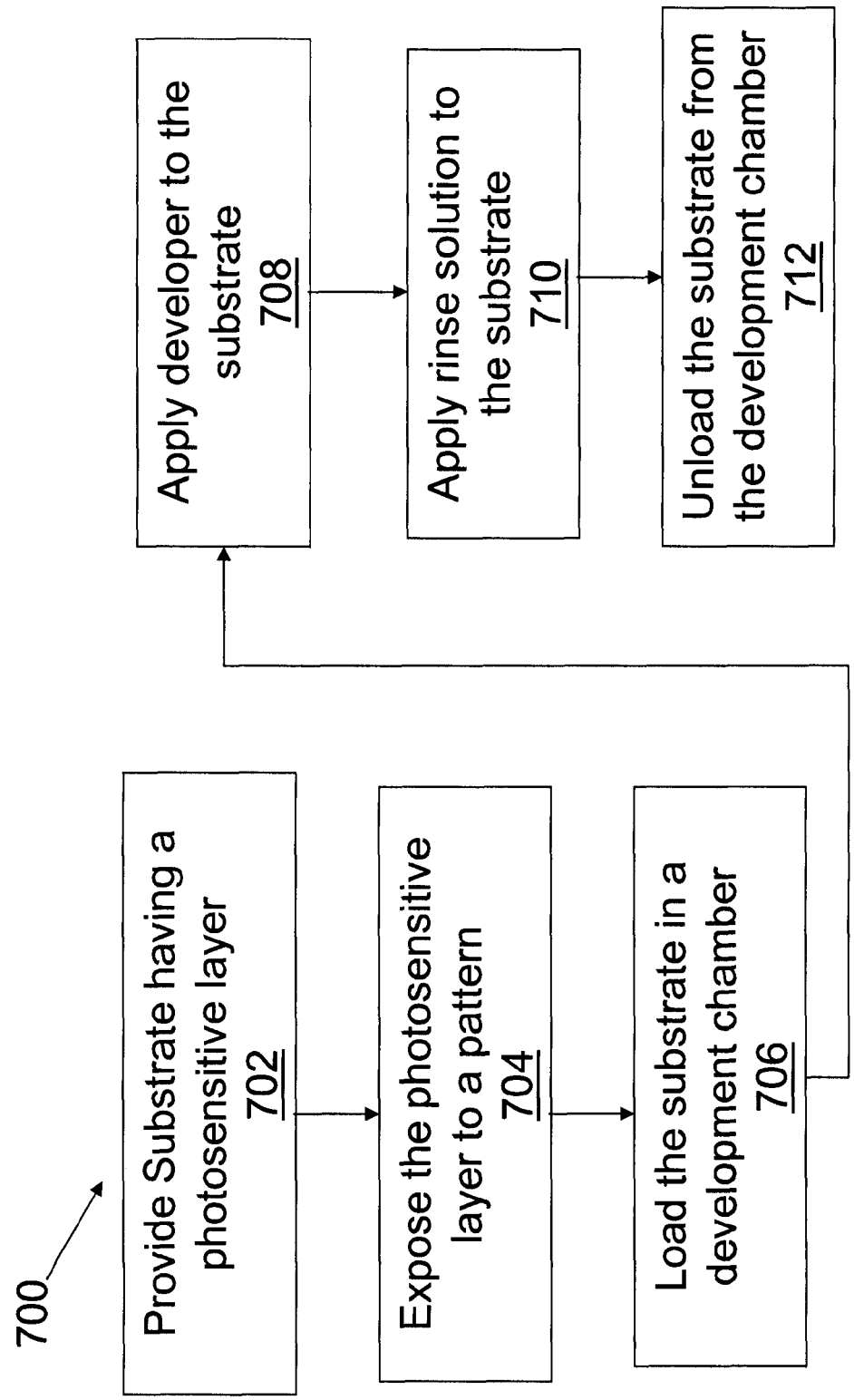
FIG. 7 is a flowchart of an embodiment of a method making a semiconductor device according to various aspects of the present disclosure in another embodiment.

Referring now to FIG. 7, illustrated is a method 700, which is an embodiment of a photolithography method. The photolithography method 700 may be used to fabricate semiconductor devices including integrated circuits or portions thereof. The method 700 starts at block 702 where a substrate having a photosensitive layer disposed thereon is provided. Block 702 may be substantially similar to block 102 and/or 104 described above with reference to the method 100 of FIG. 1. The method 700 then proceeds to block 704 where the photosensitive layer is exposed to a pattern. Block 704 may be substantially similar to block 106, described above with reference to the method 100 of FIG. 1.

The method 700 then proceeds to block 706 where the substrate is loaded into a development chamber. The development chamber may be operable to introduce a developer (such as, TMAH) and a rinse solution to the substrate. The development chamber may include spray nozzles, spin-on coating mechanisms, mechanisms for puddle application of fluid, and/or other suitable application methods. The substrate may be loaded into the development chamber by manual or robotic means.

The method 700 then proceeds to block 708 where the developer is applied to the substrate. In an embodiment, the developer is TMAH. However, one of ordinary skill in the art would recognize other developers, now known or later developed, that would be suitable for development of the exposed photosensitive layer. The developer may be selected based on the photosensitive layer composition. The developer may be applied by immersion of the substrate, spray application, puddle application, and/or other suitable application means.

The method 700 then proceeds to block 710 where a rinse solution is applied to the substrate to perform a cleaning process. The rinse solution may be substantially similar to as discussed above with reference to block 110 of the method 100. The rinse solution is applied in the same chamber as the developer of block 708. In an embodiment, no process steps are performed between the application of the developer and the application of the rinse solution. The rinse solution may be applied by immersion of the substrate, spray application, puddle application, and/or other suitable application means. In an embodiment, the rinse solution is applied in the same manner as the developer solution.

In an embodiment, the rinse solution is a de-ionized water (DIW) and ozone ($O_3$) solution. An exemplary concentration of the DIW/$O_3$ rinse solution is between approximately 1 ppm and 500 ppm of ozone; the flowrate of the rinse solution may be between approximately 100 sccm and approximately 10 slm. In the embodiment, the developer tool may be configured to provide a supply of ozone to the chamber. In an embodiment, the rinse solution is a DIW and hydrogen peroxide $H_2O_2$ solution. An exemplary concentration of DIW/$H_2O_2$ rinse solution is between approximately 0.1% and 10% by weight of $H_2O_2$; the flowrate of the rinse solution may be between approximately 100 sccm and approximately 10 slm. In the embodiment, the developer tool may be configured to provide a supply of peroxide to the chamber. In an embodiment, the rinse solution is a DIW and oxalic acid solution. An exemplary concentration of DIW/oxalic acid rinse solution is a concentration of oxalic acid between approximately 0.05% and 10% by weight; the flowrate of the rinse solution may be between approximately 100 sccm and approximately 10 slm. In the embodiment, the developer tool may be configured to provide a supply of oxalic to the chamber.

In further embodiments, a trace amount of acid may be included in the rinse solution. For example, the DIW/$O_3$ or DIW/$H_2O_2$ solutions described above may include a trace amount of acid. The trace acid may be HCl, acetic acid, citric acid, tartaric acid, and/or other similar acids. In an embodiment, the rinse solution includes between approximately 0.01 and approximately 10% by weight of HCl. In an embodiment, the rinse solution includes between approximately 0.01 and approximately 10% by weight of citric acid. In an embodiment, the rinse solution includes between approximately 0.01 and approximately 10% by weight of tartaric acid.

The method 700 then proceeds to block 712 where the substrate is removed from the chamber. The substrate may be further processed including drying processes, hard bake processes, and/or other suitable processes.

Thus, provided is a method of semiconductor fabrication that includes a post-lithography cleaning process. The rinse solution of the cleaning process includes DIW, and one or more additional components including H2O2, ozone, oxalic acid, and/or trace acids such as HCl, citric acid, acetic acid, and tartaric acid. One or more embodiments of the present disclosure may provide advantages such as, reduction of surfactant residue, improved LWR, reduction of photoresist residue and/or scum, and/or other benefits. Poor LWR can result in an impact on poly gate line width roughness, impact on the LDD implant profile, impact on the pocket implant profile, and/or influence of device performance such as, threshold voltage. Photoresist residue and/or scum can impact the LDD implant profile, impact the pocket implant profile, and/or influence the device performance such as threshold voltage. A surfactant residue can lead to issues such as photo corrosion, which in turn may cause an abnormal via profile, and/or other defects.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Thus, in an embodiment, a method of making an integrated circuit is provided. The method includes providing a substrate having a photosensitive layer. The photosensitive layer is exposed to a radiation beam. The exposed photosensitive layer is developed in a first chamber. In the first chamber, a cleaning process is performed on the developed photosensitive layer. The cleaning process includes using a rinse solution including at least one of ozone, hydrogen peroxide, and oxalic acid.

In another embodiment, a method is provided which also includes providing a semiconductor substrate. A developer is applied to the semiconductor substrate in a first chamber. A rinse solution is applied, after applying the developer, to the semiconductor substrate in the first chamber. The rinse solution includes at least one of ozone, hydrogen peroxide, and oxalic acid. The rinse solution further includes DIW. In other embodiments, an acid is also included such as HCl, acetic acid, citric acid, and tartaric acid.

In yet another embodiment, a method of semiconductor fabrication includes providing a substrate having a photosensitive layer and exposing the photosensitive layer to a radiation beam. The exposed photosensitive layer is developed. A cleaning process is performed on the developed photosensitive layer. The cleaning process includes using a rinse solution including at least one of ozone, hydrogen peroxide, and oxalic acid.

What is claimed is:
1. A method of making an integrated circuit, the method comprising:
providing a substrate having a photosensitive layer;
exposing the photosensitive layer to a radiation beam;

developing the exposed photosensitive layer, wherein the developing is performed in a first chamber; and performing a cleaning process on the developed photosensitive layer, wherein the cleaning process is formed in the first chamber, and wherein the cleaning process includes using a rinse solution including at least one of ozone, hydrogen peroxide, and oxalic acid and another acid.

2. The method of claim 1, wherein the rinse solution includes between approximately 1 ppm and approximately 500 ppm of ozone.

3. The method of claim 1, wherein the rinse solution includes between approximately 0.1 weight percent and approximately 10 weight percent of hydrogen peroxide.

4. The method of claim 1, wherein the rinse solution includes between approximately 0.05 weight percent and approximately 10 weight percent of oxalic acid.

5. The method of claim 1, wherein the another acid is selected from the group consisting of HCl, acetic acid, citric acid, and tartaric acid.

6. The method of claim 1, wherein the rinse solution includes between approximately 0.01 weight percent and approximately 10 weight percent of the another acid and the another acid is selected from the group consisting of HCl, acetic acid, citric acid, and tartaric acid.

7. The method of claim 1, wherein the performing the cleaning process includes spraying the rinse solution onto the substrate.

8. The method of claim 1, further comprising:
baking the substrate after performing the cleaning process.

9. The method of claim 1, wherein the developing including providing tetra-methyl ammonium hydroxide (TMAH).

10. A method, the method comprising:
providing a semiconductor substrate;
applying a developer to the semiconductor substrate in a first chamber; and
applying a rinse solution, after applying the developer, to the semiconductor substrate in the first chamber, wherein the rinse solution includes a first component being at least one of ozone, hydrogen peroxide, and oxalic acid; a second component being another acid; and de-ionized water.

11. The method of claim 10, wherein the rinse solution includes the first component of ozone.

12. The method of claim 10, wherein the another acid of the rinse solution is selected from the group consisting of HCl, acetic acid, citric acid, and tartaric acid.

13. The method of claim 10, wherein the rinse solution includes the first component of hydrogen peroxide.

14. The method of claim 10,
wherein the first component is hydrogen peroxide;
wherein the rinse solution includes at least approximately 0.1 weight percent (wt %) of the first component; and
wherein the rinse solution includes at least approximately 0.1 weight percent (wt %) of the another acid.

15. A method of semiconductor fabrication, comprising:
providing a substrate having a photosensitive layer;
exposing the photosensitive layer to a radiation beam;
developing the exposed photosensitive layer;
performing a cleaning process on the developed photosensitive layer, wherein the cleaning process includes using a rinse solution including oxalic acid;
performing a hard bake process on the cleaned and developed photosensitive layer to form a masking element in the photosensitive layer; and
using the masking element to pattern an underlying layer.

16. The method of claim 15, further comprising:
a de-ionized water rinse prior to the cleaning process.

17. The method of claim 15, wherein the rinse solution further comprises another acid, wherein the another acid is different from the oxalic acid.

18. The method of claim 15, wherein the cleaning process is performed at a temperature between approximately 10° C. and approximately 80° C.

* * * * *